(12) United States Patent
Dordi et al.

(10) Patent No.: US 8,133,812 B2
(45) Date of Patent: Mar. 13, 2012

(54) METHODS AND SYSTEMS FOR BARRIER LAYER SURFACE PASSIVATION

(75) Inventors: Yezdi Dordi, Palo Alto, CA (US); John Boyd, Hillsboro, OR (US); Fritz Redeker, Fremont, CA (US); William Thie, Mountain View, CA (US); Tiruchirapalli Arunagiri, Fremont, CA (US); Alex Yoon, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 12/562,955

(22) Filed: Sep. 18, 2009

(65) Prior Publication Data

US 2010/0009535 A1    Jan. 14, 2010

Related U.S. Application Data

(62) Division of application No. 11/641,364, filed on Dec. 18, 2006, now Pat. No. 7,592,259.

(51) Int. Cl.
*H01L 21/44* (2006.01)
*H01L 21/4763* (2006.01)

(52) U.S. Cl. ............... 438/687; 438/650; 257/E21.584; 257/E21.585

(58) Field of Classification Search ................ None
See application file for complete search history.

(56) References Cited

U.S. PATENT DOCUMENTS

| | | | | |
|---|---|---|---|---|
| 5,824,599 | A * | 10/1998 | Schacham-Diamand et al. | 438/678 |
| 6,268,289 | B1 * | 7/2001 | Chowdhury et al. | 438/687 |
| 6,303,498 | B1 * | 10/2001 | Chen et al. | 438/675 |
| 6,498,093 | B1 * | 12/2002 | Achuthan et al. | 438/643 |
| 2005/0098440 | A1 * | 5/2005 | Kailasam et al. | 205/183 |

* cited by examiner

*Primary Examiner* — Ha Tran T Nguyen
*Assistant Examiner* — Shaka Scarlett
(74) *Attorney, Agent, or Firm* — Larry Williams (57) ABSTRACT

This invention pertains to methods and systems for fabricating semiconductor devices. One aspect of the present invention is a method of depositing a gapfill copper layer onto a barrier layer for semiconductor device metallization. In one embodiment, the method includes forming the barrier layer on a surface of a substrate and subjecting the barrier layer to a process condition so as to form a removable passivated surface on the barrier layer. The method further includes removing the passivated surface from the barrier layer and depositing the gapfill copper layer onto the barrier layer. Another aspect of the present invention is an integrated system for depositing a copper layer onto a barrier layer for semiconductor device metallization. In one embodiment, the integrated system comprises at least one process module configured for barrier layer deposition and passivated surface formation and at least one other process module configured for passivated surface removal and deposition of copper onto the barrier layer. The system further includes at least one transfer module coupled so that the substrate can be transferred between the modules substantially without exposure to an oxide-forming environment.

12 Claims, 8 Drawing Sheets

METHODS AND SYSTEMS FOR BARRIER LAYER SURFACE PASSIVATION

CROSS-REFERENCE

The present application is a divisional of U.S. application Ser. No. 11/641,364 filed 18 Dec. 2006 now U.S. Pat. No. 7,592,259 which is related to U.S. patent application Ser. No. 11/641,361, titled "METHODS AND SYSTEMS FOR LOW INTERFACIAL OXIDE CONTACT BETWEEN BARRIER AND COPPER METALLIZATION," to Fritz REDEKER, John BOYD, Yezdi DORDI, Alex YOON, and Shijian Li, filed Dec. 18, 2006; U.S. patent application Ser. No. 11/382,906, filed May 11, 2006 now U.S. Pat. No. 7,306,662; U.S. patent application Ser. No. 11/427,266, filed Jun. 28, 2006 now U.S. Pat. No. 7,297,190; U.S. patent application Ser. No. 11/461,415, filed Jul. 31, 2006; U.S. patent application Ser. No. 11/514,038, filed Aug. 30, 2006; U.S. patent application Ser. No. 10/357,664, filed Feb. 3, 2003 now U.S. Pat. No. 7,191,787; U.S. patent application Ser. No. 10/879,263, filed Jun. 28, 2004 now U.S. Pat. No. 7,704,367; and U.S. patent application Ser. No. 10/607,611, filed Jun. 27, 2003 now U.S. Pat. No. 7,153,400; all of these patents and/or applications are incorporated herein, in their entirety, by this reference.

BACKGROUND

This invention relates to improved methods and systems for the metallization of semiconductor devices such as integrated circuits, memory cells, and the like that use copper metallization; more specifically this invention relates to methods and systems for copper-based metallization of silicon integrated circuits.

An important part of the fabrication of semiconductor devices is the metallization of the devices to electrically interconnect the device elements. For many such devices, the metallization of choice includes the use of copper metal lines. Metallization systems that use copper metal lines also must use a barrier material to isolate the copper from copper sensitive areas of the electronic devices. Some of the barrier layers of interest for copper metallization are materials such as tantalum and such as tantalum nitride. The usual fabrication process for metallization systems that use copper involves the deposition of copper onto the barrier layers. A preferred process for depositing the copper onto the barrier layer is electroless copper deposition.

One problem that occurs for the standard technology used for copper metallization is that many of the preferred barrier materials such as tantalum and tantalum nitride, if exposed to air for extended periods of time, can form oxides such as tantalum oxide and tantalum oxynitride on the surface of the barrier layer. It is known that electroless deposition of copper onto the barrier layer is inhibited if there is oxide present on the barrier layer. In addition, copper does not adhere to the oxide on the barrier layer as well as it adheres to the pure barrier metal or metal rich barrier layer surface, such as tantalum and tantalum-rich surface on tantalum nitride. Tantalum and/or tantalum nitride barrier layers are only presented here as examples; similar problems occur for other barrier layer materials. The poor adhesion can negatively affect the electro-migration performance and reliability of the semiconductor devices. In addition, the formation of tantalum oxide or tantalum oxynitride on the barrier layer surface can increase the resistivity of the barrier layer. More specifically, the presence of the oxide between the barrier layer and the composite copper can reduce the performance for the electronic devices and reduce the reliability of the electronic devices fabricated using standard copper metallization technology.

Clearly, there are numerous applications requiring high-performance high reliability electronic devices. The problems that occur for the standard technology for fabricating electronic devices using copper metallization indicate there is a need for methods and systems that can allow the fabrication of electronic devices using copper metallization with improved performance and improved reliability.

SUMMARY

This invention pertains to methods and systems for fabricating semiconductor devices. The present invention seeks to overcome one or more of the deficiencies of the standard technologies for fabricating semiconductor devices such as integrated circuits, memory cells, and the like that use copper metallization.

One aspect of the present invention is a method of depositing a gapfill copper layer onto a transition metal barrier layer or transition metal compound barrier layer for semiconductor device metallization so as to produce a substantially oxygen-free interface therebetween. In one embodiment, the method comprises forming the barrier layer on a surface of a substrate and subjecting the barrier layer to a process condition so as to form a removable passivated surface on the barrier layer. The method further comprises removing the passivated surface from the barrier layer and depositing the gapfill copper layer onto the barrier layer.

Another aspect of the present invention is an integrated system for depositing a copper layer onto a transition metal barrier layer or transition metal compound barrier layer for semiconductor device metallization so as to produce a substantially oxygen-free interface therebetween. In one embodiment, the integrated system comprises at least one process module configured for barrier layer deposition and passivated surface formation and at least one other process module configured for passivated surface removal and deposition of copper onto the barrier layer. The system further includes at least one transfer module coupled to the at least one process module and to the at least one other process module. The at least one transfer module is configured so that the substrate can be transferred between the modules substantially without exposure to an oxide-forming environment.

It is to be understood that the invention is not limited in its application to the details of construction and to the arrangements of the components set forth in the following description or illustrated in the drawings. The invention is capable of other embodiments and of being practiced and carried out in various ways. In addition, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods, and systems for carrying out aspects of the present invention. It is important, therefore, that the claims be regarded as including such equivalent constructions insofar as they do not depart from the spirit and scope of the present invention.

Skilled artisans appreciate that elements in the figures are illustrated for simplicity and clarity and have not necessarily been drawn to scale. For example, the dimensions of some of the elements in the figures may be exaggerated relative to other elements to help to improve understanding embodiments of the present invention.

DESCRIPTION

This invention pertains to methods and systems for fabricating semiconductor devices. More specifically, the present invention pertains to metallization for integrated circuits using barrier layers and metal lines. The operation of embodiments of the present invention will be discussed below, primarily, in the context of transition metal barrier layers or transition metal compound barrier layers and copper metal lines for silicon integrated circuits. However, it is to be understood that embodiments in accordance with the present invention may be used for other metallization systems for which a substantially oxygen-free interface between the barrier layer and metal line is needed.

In the following description of the figures, identical reference numerals have been used when designating substantially identical elements or steps that are common to the figures.

For the following description, the term "passivated surface" is defined here to mean a surface that does not form a substantial amount of oxide compounds and does not contain a substantial amount of oxygen bound as a component of the passivated surface. Furthermore, the passivated surface is characterized as being resistant to the transport of oxygen or it otherwise prevents substantial oxidation of materials beneath the passivated surface for later process steps. It is also to be understood that the passivated surface may have a thickness of an atomic monolayer but is not restricted to a monolayer thickness. For some embodiments of the present invention, the passivated surface may be a layer of material having a thickness greater than the thickness of a monolayer.

Figure 1:
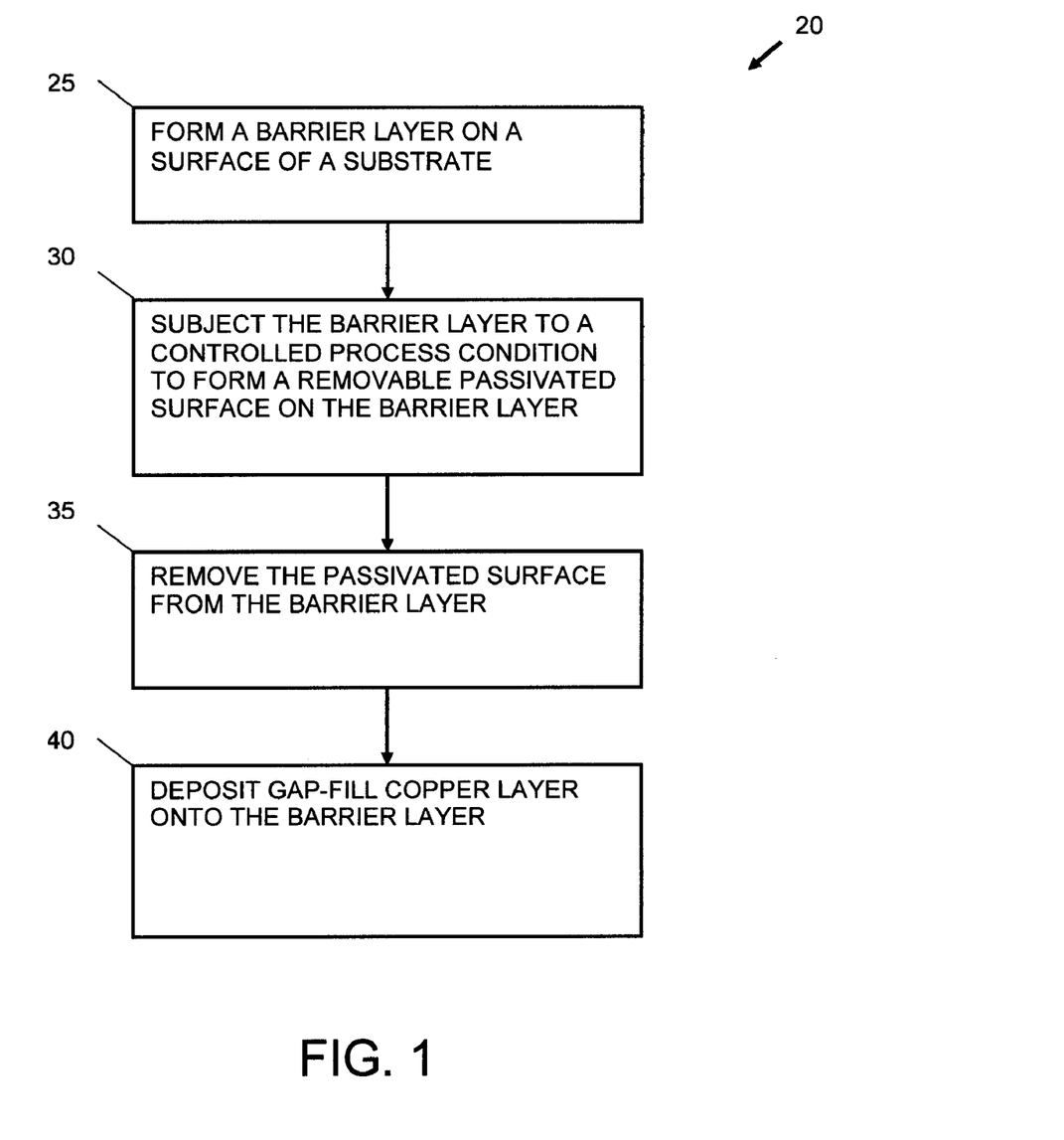
FIG. 1 is a process flow diagram of an embodiment of the present invention.

Reference is now made to FIG. 1 where there is shown a process flow diagram 20 according to one embodiment of the present invention. Process flow diagram 20 shows a method of depositing a gapfill copper layer onto a transition metal barrier layer or transition metal compound barrier layer for integrated circuit metallization so as to produce a substantially oxygen-free interface between the barrier layer and the copper layer. Process flow diagram 20 includes step 25, step 30, step 35, and step 40. Step 25 includes forming a barrier layer on a surface of a substrate. Step 30 includes subjecting the barrier layer to at least one controlled process condition so as to form a removable passivated surface on the barrier layer. Step 35 includes removing the passivated surface from the barrier layer. Step 40 includes depositing the gapfill copper layer onto the barrier layer. Process flow 20 is carried out so that there is substantially no oxide present between the barrier layer and the gapfill copper layer.

Numerous embodiments of the present invention can be obtained as a result of selecting various options for carrying out the steps shown in process flow diagram 20. Step 25 can be accomplished by one or more processes such as physical vapor deposition, chemical vapor deposition, and atomic layer deposition. A variety of materials or material systems can be used for the barrier layer formed in step 25. The material selected for the barrier layer will be a factor influencing the selection of the process used for forming the barrier layer. In a preferred embodiment of the present invention, step 25 involves forming a barrier layer that includes a transition metal or a transition metal compound. For copper metallization systems, preferred barrier layer materials for embodiments of the present invention are tantalum, tantalum nitride, or a combination of the two. Tantalum and tantalum nitride can be deposited by physical vapor deposition processes. However, for preferred embodiments of the present invention, step 25 is accomplished using atomic layer deposition to deposit tantalum nitride barrier layers.

A further step (not shown in FIG. 1) that is optional for some embodiments of the present invention includes treating the surface of the barrier layer after the barrier has been formed. Treating the surface of the barrier layer may be performed in a variety of ways; the step is selected so as to prepare the surface of the barrier layer for follow-on processing steps. Treating the surface of the barrier layer is primarily directed toward improving the surface adhesion or improving the contact resistance for layers deposited on the barrier layer. According to one embodiment of the present invention, treating the surface of the barrier layer includes subjecting the surface of the barrier layer to a hydrogen containing plasma. The hydrogen containing plasma may be configured to remove contaminants or other materials on the surface of the barrier layer such as to decompose metal oxide or metal nitride formed on the surface of the barrier layer to a metal so as to produce a metal rich surface at the surface of the barrier layer. An example of a suitable hydrogen containing plasma for treating the surface of the barrier layer is described in commonly owned U.S. patent application Ser. No. 11/514,038, filed on Aug. 30, 2006 and is incorporated herein in its entirety by this reference.

As another option, treating the surface of the barrier may include enriching the surface of the barrier layer with a metal such as by depositing the metal onto the surface of the barrier layer. A preferred method for embodiments of the present invention for treating the surface of the barrier includes depositing a metal using a plasma implantation process to incorporate the metal with the surface of the barrier layer. Preferably, treating the barrier layer surface is performed either as part of step 25 or at another point in the process prior to forming the removable passivated surface on the barrier layer. It is to be understood that treating the barrier layer surface is not a required step for all embodiments of the present invention.

According to preferred embodiments of the present invention, the process conditions used for forming the removable passivated surface on the barrier layer are selected so that the passivated surface is substantially free of oxygen. This means that the process conditions are selected so that they do not require the use of oxygen or oxygen compounds that can result in the oxidation of the surface of the barrier layer or incorporation of oxygen into the passivated surface.

A variety of processes and process conditions can be used for step 30 of process flow 20. As options for step 30, atomic layer deposition or physical vapor deposition can be used to form the passivated surface on the barrier layer formed in step 25. In one embodiment of the present invention, step 30 includes depositing an effective amount of ruthenium to form the passivated surface. The effective amount of ruthenium constitutes an amount sufficient for substantially preventing oxide formation on or in the underlying barrier layer. The thickness of ruthenium used for preventing oxidation may be about 2-10 monolayers for some embodiments of the present invention. For other embodiments of the present invention, step 30 includes depositing an effective amount of at least one of the elements cobalt, rhodium, rhenium, osmium, iridium, and molybdenum to form the passivated surface. Again, the effective amount constitutes an amount sufficient for substantially preventing oxide formation on or in the underlying barrier layer.

As another option for embodiments of the present invention, step 30 for process flow 20 is accomplished by forming a passivated surface containing silicon. More specifically for one embodiment, step 30 includes subjecting the barrier layer to a reactive gas containing silicon so that silicon is available to form the passivated surface. Optionally, step 30 may include a silicidation process in which silicon is deposited onto the surface of a transition metal or transition metal compound barrier layer. The barrier layer and the silicon are heated an effective amount so as to form a silicide with the transition metal at the surface of the barrier layer. As another option, step 30 may include depositing a metal and silicon onto the barrier layer so as to form a silicide as the passivated surface. In a preferred embodiment of the present invention, process flow 20 uses tantalum or tantalum nitride for the barrier layer and step 30 includes forming a tantalum silicide for the passivated surface.

As indicated above, embodiments of the present invention are not limited to a passivated surface formed by depositing a layer of material onto the barrier layer. Optionally, the passivated surface may be formed by a chemical reaction with the surface of the barrier layer to form a halogen compound at the surface of the barrier layer sufficient to prevent substantial oxide formation on or in the barrier layer. According to one embodiment of the present invention, process step 30 of process flow 20 is accomplished by subjecting the barrier layer to a reactive gas containing one or more of the elements fluorine, bromine, and iodine to form the passivated surface. Preferably, the reactive gas is generated from a compound containing one or more of the elements fluorine, bromine, and iodine. As an option, the reactive gas may be generated from a glow discharge plasma using a suitable feed gas such as a glow discharge plasma containing one or more of the elements fluorine, bromine, and iodine.

The process of forming the barrier layer as indicated by step 25 and process flow 20 can be performed using a process in which an electrostatic chuck is used to hold the substrate in place during the barrier deposition step. The generation of the electrostatic forces that hold the substrate is usually referred to as chucking the substrate. The neutralization of the electrostatic forces so as to release the substrate is usually referred to as dechucking. For some processes, dechucking involves running a plasma at suitable process conditions to neutralize the electrostatic forces so that the substrate can be released.

Another embodiment of the present invention is a process flow as shown in FIG. 1 in which step 25 uses an electrostatic chuck for holding the substrate during formation of the barrier layer and step 30 uses plasma process conditions for forming the passivated surface while also providing conditions for dechucking the substrate. More specifically for some embodiments of the present invention, step 30 uses reactive gases in a plasma to form the passivated surface and to provide the charge needed to dechuck the substrate. One approach would be to replace one or more of the gases typically used for dechucking the substrate with one or more reactive gases for forming the passivated surface. Some examples of suitable gases are gases containing one or more of the elements fluorine, bromine, and iodine.

Step 35 includes removing the passivated surface from the barrier layer and can be accomplished by a variety of processes such as dry etch processes and such as liquid chemical etch processes. As options, the dry etch processes may be processes such as etching with reactive gases to remove the passivated surface and such as plasma enhanced etch processes. Examples of liquid etch processes are etching with acid solutions, etching with base solutions, and removal with solvents. For a preferred embodiment of the present invention, the passivated surface is selected to have properties so that it is removed by solutions used for electroless copper deposition. In other words, a preferred embodiment of the present invention includes removing the passivated surface as part of an electroless copper deposition process.

More preferably, the passivated surface has properties so as to have some survivability during electroless copper deposition using aqueous solutions. This means that it is preferable for the passivated surface to remain intact to protect the barrier layer from oxidation and the passivated surface is removed in situ during electroless copper plating.

A variety of processes and process conditions can be used for performing step 40. As an option for step 40, electroless deposition can be used to deposit the gapfill copper layer onto the barrier layer formed in step 25. In a more preferred embodiment, step 40 includes using electroless deposition to deposit a copper seed layer followed by an electroplated copper gapfill layer. Electroless copper deposition and electrochemical plating process are well-known wet processes.

In yet another embodiment of the present invention, process flow 20 further comprises at least one of storing the substrate with passivated surface on the barrier layer for an amount of time and transporting the substrate to a preparation module for preparing the substrate for depositing the gapfill copper layer. This embodiment of the present invention is suitable for a passivated surface that is capable of protecting the underlying barrier layer from oxide formation during transport or during storage under environmental conditions other than those in a vacuum transfer module or controlled environment transfer module. More particularly, this embodiment of the present invention uses a passivated surface that can prevent substantial oxide formation of the underlying barrier layer for extended periods of time or exposure to process conditions that may or may not cause oxide formation in the absence of the passivated surface. One embodiment of the present invention includes process flow 20 in which the passivated surface is configured to prevent substantial oxide formation on the barrier layer when transporting or storing the barrier layer with the passivated surface in an oxygen containing environment.

According to another embodiment of the present invention, process step 30 includes forming a passivated surface on the barrier layer that has autocatalytic properties for electroless deposition of copper. More specifically, the passivated surface formed in step 30 has properties that protect the underlying barrier layer from oxide formation. The passivated surface also has properties that catalyze electroless deposition of copper. In one embodiment of the present invention, the passivated surface participates in a displacement reaction where copper in the electroless deposition solution displaces the material of the passivated surface.

Figure 1A:
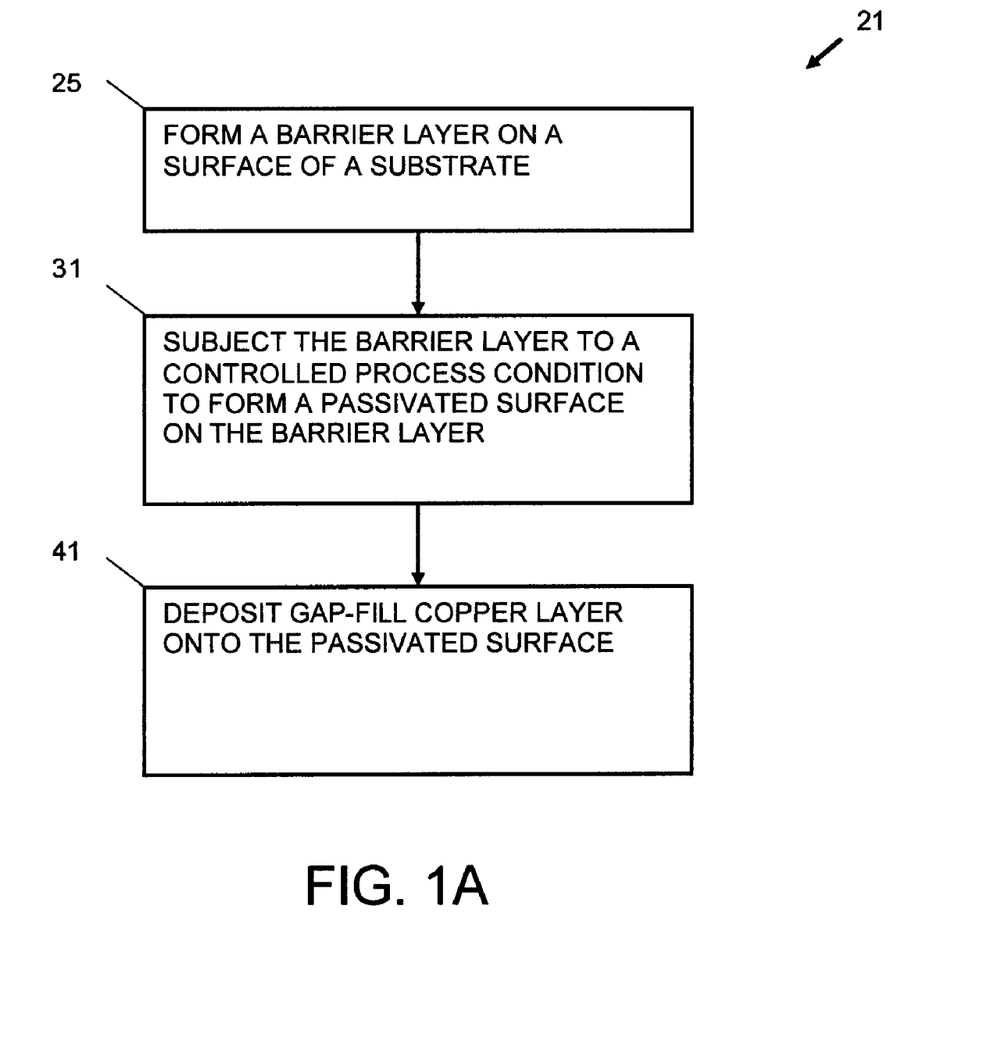
FIG. 1A is a process flow diagram of an embodiment of the present invention.

It is to be understood that step 35 is an optional step for some embodiments of the present invention. In other words, another embodiment of the present invention is the process flow shown in FIG. 1A that includes step 25, step 31, and step 40; step 35 is not used. Specifically, the passivated surface is not removed and remains an integral component of the barrier and copper interconnect material during electroless copper plating or other copper deposition processes. Step 25 is essentially the same as described for the process flow in FIG. 1. Step 31 is essentially the same as step 30 with the exception that the passivated surface does not need to be removable in follow-on processes. Step 41 is essentially the same as step 40 with the exception that copper is deposited on to the passivated surface.

Figure 2:
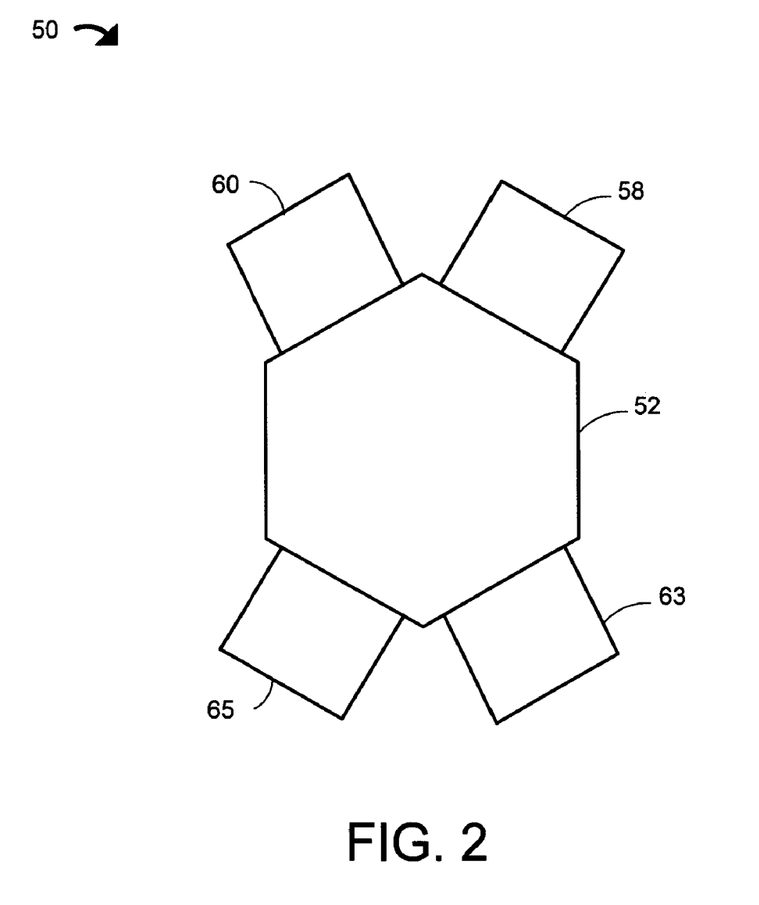
FIG. 2 is a diagram of an embodiment of the present invention.

Reference is now made to FIG. 2 where there is shown a schematic diagram of an exemplary integrated system 50, according to one embodiment of the present invention, for depositing a copper layer onto a transition metal barrier layer or transition metal compound barrier layer on substrates for integrated circuit metallization. Integrated system 50 is configured so as to produce a substantially oxygen-free interface between the barrier layer and the copper layer. A preferred embodiment of integrated system 50 is configured to substantially perform the steps of process flow 20 and variations thereof.

For the embodiment shown in FIG. 2, integrated system 50 comprises at least one transfer module 52, a barrier deposition module 58, a passivated surface formation module 60, a passivated surface removal module 63, and a copper gapfill module 65. Integrated system 50 is configured so that it allows minimal exposure of the substrate surface to oxygen at critical steps for which oxide formation is undesirable. In addition, since it is an integrated system, the substrate can be transferred from one process module immediately to the next station, which limits the duration of exposure to oxygen.

According to one embodiment of the present invention, integrated system 50 is configured to process substrate(s) through the entire process sequence of process flow 20 of FIG. 1 and variations thereof. More specifically, barrier deposition module 58 is configured to form a barrier layer on a substrate. Preferably, barrier deposition module 58 is configured to deposit a barrier layer material such as tantalum, tantalum nitride, and combinations of the two. As an option, barrier deposition module 58 can be configured for physical vapor deposition of the barrier layer or atomic layer deposition of the barrier layer. In a preferred embodiment, barrier deposition module 58 is configured for atomic layer deposition. In one possible configuration, barrier deposition module 58 is configured for an atomic layer deposition process operated at less than 1 Torr. As another option, barrier deposition module 58 is configured for atomic layer deposition for a high-pressure process using supercritical $CO_2$ and organometallic precursors to form the barrier layer. In yet another configuration, barrier deposition module 58 is configured for a physical vapor deposition process operating at pressures less than 1 Torr. Details of an exemplary reactor for a high pressure process using supercritical $CO_2$ is described in commonly assigned application Ser. No. 10/357,664, titled "Method and Apparatus for Semiconductor Wafer Cleaning Using High-Frequency Acoustic Energy with Supercritical Fluid", filed on Feb. 3, 2003, which is incorporated herein by this reference. Once the barrier layer is formed, the substrate should be transferred in a controlled-ambient environment to limit exposure to oxygen; this is accomplished with transfer module 52.

Passivated surface formation module 60 is configured to form a passivated surface, as defined above, on the barrier layer. Passivated surface formation module 60 can be implemented in a wide variety of configurations for forming the passivated surface. In one configuration, passivated surface formation module 60 is configured to subject the barrier layer to a reactive gas mixture containing one or more of the elements fluorine, bromine, and iodine so as to form a halide compound on the barrier layer sufficient to prevent oxidation of the underlying barrier layer. As a further option, passivated surface formation module 60 is configured to generate a plasma in a gas containing one or more of the elements fluorine, bromine, and iodine for forming the passivated surface.

Optionally, passivated surface formation module 60 is configured to subject the barrier layer to a reactive gas containing silicon so as to deposit a thin layer of silicon on the barrier layer. In another embodiment, passivated surface formation module 60 is configured to subject the barrier layer to a reactive gas containing silicon and heating the substrate an effective amount so as to form a silicide with the transition metal at the surface of the barrier layer. Passivated surface formation module 60 may be configured for other types of silicidation processes to form the passivated surface. As another option, passivated surface formation module 60 is configured to deposit a metal and silicon onto the barrier layer so as to form a silicide. For a preferred embodiment, passivated surface formation module 60 is configured for atomic layer deposition of an effective amount of at least one of cobalt, rhodium, rhenium, osmium, iridium, and molybdenum to substantially prevent oxidation of the underlying barrier layer. More particularly, the passivated surface formation module comprises an atomic layer deposition module, a silicon deposition module, or a silicidation module for some embodiments of the present invention.

According to one embodiment of the present invention, passivated surface formation module 60 is a deposition module. Examples of suitable types of the deposition module are chemical vapor deposition module, atomic layer deposition module, plasma enhanced chemical vapor deposition module, and physical vapor deposition module. The deposition module deposits the material of the passivated surface onto the surface of the barrier layer.

According to another embodiment of the present invention, passivated surface formation module is a chemical reactor that causes a chemical reaction with the surface of the barrier layer. The product of the chemical reaction forms the passivated surface.

Passivated surface removal module 63 is configured to remove the passivated surface from the barrier layer. Passivated surface removal module 63 can be implemented in a variety of configurations. For specific embodiments of the present invention, the configuration of passivated surface removal module 63 will depend on the type of passivated surface to be removed.

As one option, passivated surface removal module 63 is a dry etch module that uses reactive gases to remove the passivated surface or a plasma etch module such as a module configured for plasma enhanced etch processes. As another option, passivated surface removal module 63 is a liquid etch module that uses processes such as etching with acid solutions, etching with base solutions, and removal with solvents. For a preferred embodiment of the present invention, passivated surface removal module 63 is configured so that its processes are compatible with the follow-on processes for depositing copper.

According to a preferred embodiment of the present invention, the properties of the passivated surface are selected so that the passivated surface has some amount of survivability so as to provide some protection from oxidation during an electroless copper deposition process. More specifically, this means that the passivated surface is selected so that it is removed during the electroless copper deposition process. As an option, the passivated surface is removed from the barrier layer as copper is deposited on the surface of the barrier layer. An additional option includes leaving the passivated surface intact and depositing the copper layer directly on the passivated surface.

Copper gapfill module 65 is configured to deposit a gapfill copper layer. Optionally, copper gapfill module 65 can be configured to deposit the gapfill copper layer using electroless deposition, electrochemical plating, or electroless deposition and electrochemical plating. More specifically, copper gapfill module 65 may be configured to deposit a conformal copper seed layer on the barrier surface, followed by a thick copper gapfill (or bulk fill) process. In one embodiment, copper gapfill module 65 is configured to perform an electroless process to produce a conformal copper seed layer. Copper gapfill module 65 can be further configured for a thick copper bulk fill process by an electroless deposition process or an electrochemical plating process. Electroless copper deposition and electrochemical plating process are well-known wet processes. For a wet process to be integrated in a system with controlled processing and transporting environment, the reactor needs to be integrated with a rinse/dryer to enable dry-in/dry-out process capability. In addition, the system needs to be filled with inert gas to ensure minimal exposure of the substrate to oxygen. Recently, a dry-in/dry-out electroless copper process has been developed. Further, all fluids used in the process are de-gassed, i.e. dissolved oxygen is removed by commercially available degassing systems.

The environment for electroless deposition also needs to be controlled to provide low (or limited) levels of oxygen and moisture (water vapor). Inert gas can also be used in copper gapfill module 65 to ensure low levels of oxygen are in the processing environment. Copper gapfill module 65 can be configured to perform the electroless deposition process in a number of ways, such as puddle-plating, where fluid is dispensed onto a substrate and allowed to react in a static mode, after which the reactants are removed and discarded, or reclaimed. In another embodiment, copper gapfill module 65 includes a proximity process head to limit the electroless process liquid so that it is only in contact with the substrate surface on a limited region. The substrate surface that is not under the proximity process head is dry. Details of such a process and system can be found in U.S. application Ser. No. 10/607,611, titled "Apparatus And Method For Depositing And Planarizing Thin Films Of Semiconductor Wafers," filed on Jun. 27, 2003, and U.S. application Ser. No. 10/879,263, titled "Method and Apparatus For Plating Semiconductor Wafers," filed on Jun. 28, 2004, both of which are incorporated herein in their entireties.

The at least one transfer module 52 is configured for vacuum transfer of the substrate or controlled environment transfer of the substrate. Alternatively, the at least one transfer module 52 may comprise two transfer modules with one transfer module configured for vacuum transfer and a second transfer module configured for controlled environment transfer. Transfer module 52 is coupled to barrier deposition module 58, passivated surface formation module 60, passivated surface removal module 63, and copper gapfill module 65. Transfer module 52 is configured so that the substrate can be transferred between the modules substantially without exposure to an oxygen-containing environment or an oxide-forming environment.

Wet processes such as those performed in copper gapfill module 65 and such as those that may be performed in passivated surface removal module 63 are typically operated near atmospheric pressure, while the dry processes such as those performed in barrier deposition module 58, passivated surface formation module 60, and possibly passivated surface removal module 63 are usually operated at less than 1 Torr. Therefore, integrated system 50 needs to be able to handle a mixture of dry and wet processes. The least at one transfer module 52 is equipped with one or more robots to move the substrate from one process area to another process area. The process area could be a substrate cassette, a reactor, or a loadlock (cassette and loadlock not shown in FIG. 2).

As described above, it is important to control the processing and transport environments to minimize the exposure of the barrier layer surface to oxygen prior to forming the passivated surface so as to avoid formation of an oxide on the barrier layer. The substrate should be processed under a controlled environment, where the environment is either under vacuum or filled with one or more inert gas(es) to limit the exposure of the substrate to oxygen. To provide a controlled environment for substrate transfer, transfer module 52 is configured so that the environment is controlled to be free of oxygen. In one exemplary configuration, transfer module 52 is configured to have inert gas(es) fill the transfer module during substrate transfer. Additionally, all fluids used in the process are de-gassed, i.e. dissolved oxygen is removed by commercially available degassing systems. Exemplary inert gas includes nitrogen ($N_2$), helium (He), neon (Ne), argon (Ar), krypton (Kr), and xenon (Xe).

Figure 3:
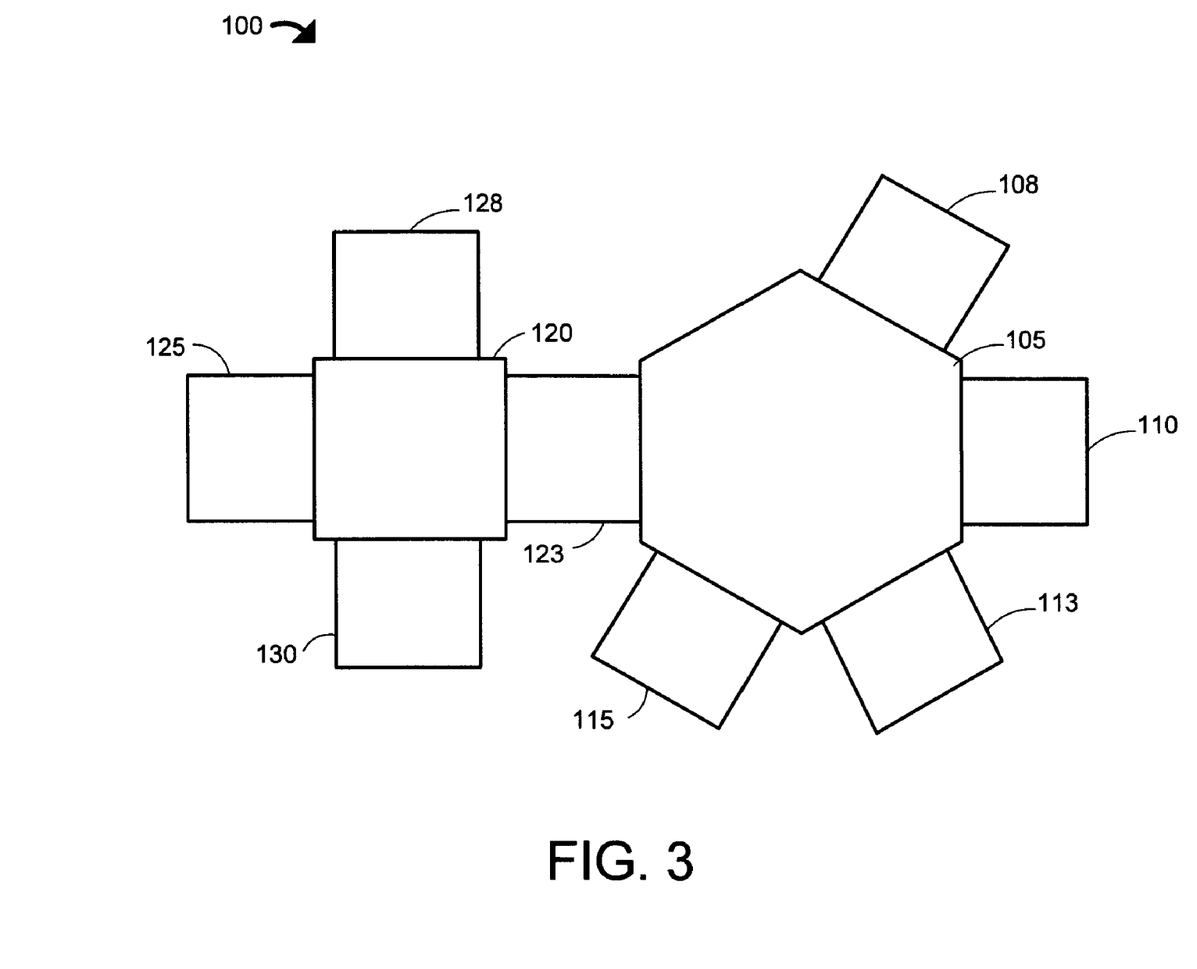
FIG. 3 is a diagram of an embodiment of the present invention.

Reference is now made to FIG. 3 where there is shown a schematic diagram of an exemplary integrated system 100, according to another embodiment of the present invention, for depositing a copper layer onto a transition metal barrier layer or transition metal compound barrier layer on substrates for integrated circuit metallization. Integrated system 100 is configured so as to produce a substantially oxygen-free interface between the barrier layer and the copper layer. A preferred embodiment of integrated system 100 is configured to perform the steps of process flow 20 and variations thereof.

Integrated system 100 comprises a vacuum transfer module 105 connected with a barrier deposition module 108, a loadlock 110, a barrier treatment module 113, and a passivated surface formation module 115. Integrated system 100 also includes a controlled environment transfer module 120 connected with a passivated surface removal module 125, a copper seed deposition module 128, and a copper gapfill module 130. A second loadlock 123 is included in integrated system 100 for joining vacuum transfer module 105 and control environment transfer module 120.

For integrated system 100, barrier deposition module 108 is configured so as to have essentially the same structure as described above for barrier deposition module 58; passivated surface formation module 115 is configured so as to have essentially the same structure as described above for passivated surface formation module 60. Loadlock 110 is provided to allow substrate transfer for vacuum transfer module 105 while maintaining vacuum conditions for vacuum transfer module 105.

Barrier treatment module 113 is configured to treat the surface of the barrier layer after formation of the barrier layer. More specifically, barrier treatment module 113 is configured so as to prepare the surface of the barrier layer for follow-on processing steps. Primarily, barrier treatment module 113 is configured to produce an improvement of surface properties for the barrier layer such as to obtain improved surface adhesion and such as to improve the contact resistance for layers deposited on the barrier layer. According to one embodiment of the present invention, barrier treatment module 113 includes a plasma chamber configured to subject the surface of the barrier layer to a hydrogen containing plasma so as to remove contaminants on the surface of the barrier layer or decomposed metal oxides formed on the surface of the barrier layer so as to produce a metal rich surface at the surface of the barrier layer.

As another option, barrier treatment module 113 is configured to enrich the surface of the barrier layer with a metal such as by depositing the metal onto the surface of the barrier layer. In a preferred configuration, barrier treatment module 113 includes a plasma chamber configured for plasma implantation of a metal. The implanted metal is incorporated with the surface of the barrier layer to produce a metal rich surface for the barrier layer.

Vacuum transfer module 105 is configured for operation under vacuum (<1 Torr). Controlled environment transfer module 120 is configured for operation at around 1 atmosphere pressure. Load lock 123 is placed between vacuum transfer module 105 and controlled environment transfer module 125 to allow substrate transfer between the two modules operated under different pressures while preserving the integrity of the environments in each transfer module. Load lock 123 is configured to be operated under vacuum at a pressure less than 1 Torr, or at lab ambient, or to be filled with an inert gas selected form a group of inert gases.

Passivated surface removal module 125 is configured to remove the passivated surface formed in passivated surface formation module 115. Passivated surface removal module 125 is preferably configured to remove the passivated surface using processes that operate at about atmospheric pressure such as removal processes that use liquid chemicals for removing the passivated surface. In one embodiment, passivated surface removal module 125 comprises a liquid etch process module configured to perform liquid etch processes such as etching with acid solutions, etching with base solutions, and removal with solvents. For a more preferred embodiment of the present invention, passivated surface removal module 63 is configured so that its processes are compatible with the follow-on processes for depositing copper.

Copper seed deposition module 128 is configured to deposit a conformal copper seed layer on the barrier surface. Preferably, copper seed deposition module 128 is configured to perform an electroless process to produce the copper seed layer. Copper gapfill module 130 is configured for a thick copper bulk fill process by an electroless deposition process or an electrochemical plating process. As stated above, electroless copper deposition and electrochemical plating are well-known wet processes. For a wet process to be integrated in a system with controlled processing and transporting environment, the reactor needs to be integrated with a rinse/dryer to enable dry-in/dry-out process capability. In addition, the system needs to be filled with inert gas to ensure minimal exposure of the substrate to oxygen. Recently, a dry-in/dry-out electroless copper process has been developed. Further, all fluids used in the process are de-gassed, i.e. dissolved oxygen is removed by commercially available degassing systems.

Wet processes such as those performed in passivated surface removal module 125, copper seed deposition module 128, and copper gapfill module 130 are typically operated near atmospheric pressure, while the dry processes such as those performed in barrier deposition module 108, passivated surface formation module 115, and barrier clean module 113 are usually operated at less than 1 Torr. Therefore, integrated system 50 needs to be able to handle a mixture of dry and wet processes. Vacuum transfer module 105 and controlled environment transfer module 120 are equipped with one or more robots to move the substrate from one process area to another process area. The process area could be a substrate cassette, a reactor, or a loadlock (cassette and loadlock not shown in FIG. 3).

Figure 4:
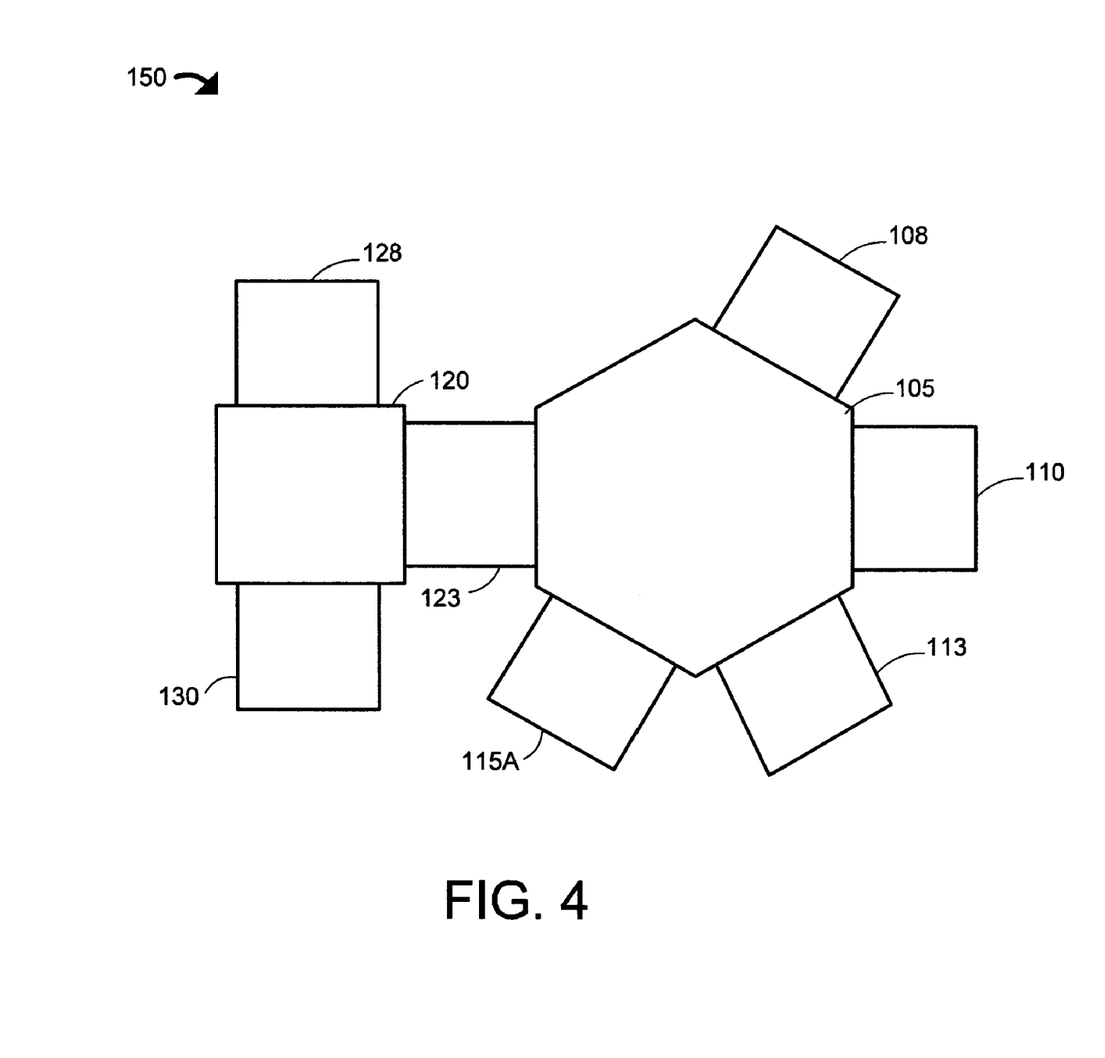
FIG. 4 is a diagram of an embodiment of the present invention.

Reference is now made to FIG. 4 where there is shown a schematic diagram of an exemplary integrated system 150 according to another embodiment of the present invention for depositing a copper layer onto a transition metal barrier layer or transition metal compound barrier layer on substrates for integrated circuit metallization. Integrated system 150 is configured so as to produce a substantially oxygen-free interface between the barrier layer and the copper layer. A preferred embodiment of integrated system 150 is configured to substantially perform the steps of process flow 20 and variations thereof.

Integrated system 150 comprises a vacuum transfer module 105 connected with a barrier deposition module 108, a loadlock 110, a barrier treatment module 113, and a passivated surface formation module 115A. Integrated system 150 also includes a controlled environment transfer module 120 connected with a copper seed deposition module 128, and a copper gapfill module 130. A second loadlock 123 is included in integrated system 150 for joining vacuum transfer module 105 and controlled environment transfer module 120.

Integrated system 150 is essentially the same as integrated system 100 described for FIG. 3 with the exception that integrated system 150 is configured so that passivated surface formation module 115A forms a passivated surface that is removed in situ during electroless copper deposition. In other words, the passivated surface has some survivability in aqueous solutions used for electroless copper deposition. The passivated surface is removed in copper seed deposition module 128 or copper gapfill module 130 as part of or in preparation for copper seed deposition or copper gapfill. More specifically, integrated system 150 includes copper seed deposition module 128 configured for passivated surface removal and for copper seed deposition. Optionally, the passivated surface is retained in copper seed deposition module 128 or copper gapfill module 130 as part of copper seed deposition or copper gapfill.

Figure 5:
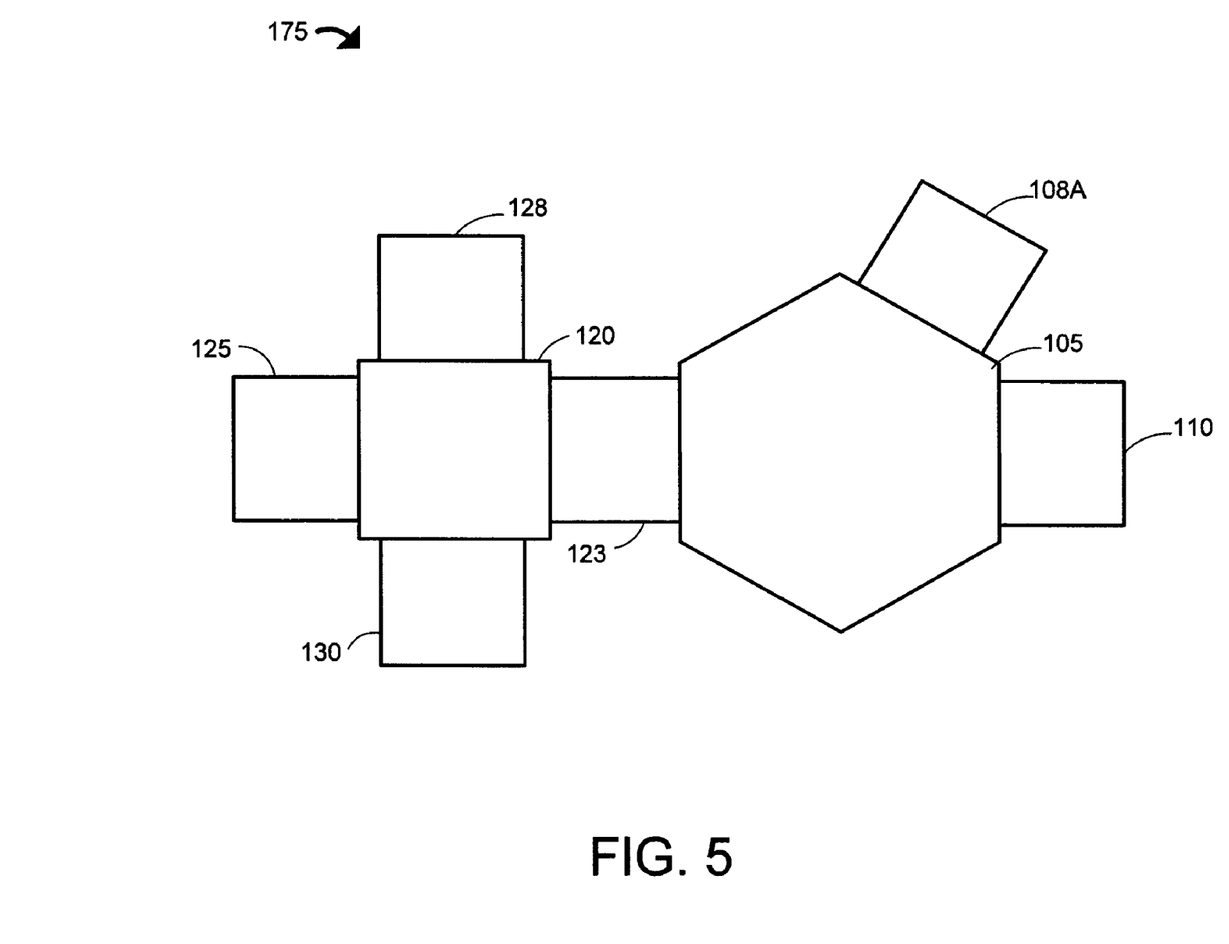
FIG. 5 is a diagram of an embodiment of the present invention.

Reference is now made to FIG. 5 where there is shown a schematic diagram of an exemplary integrated system 175, according to another embodiment of the present invention, for depositing a copper layer onto a transition metal barrier layer or transition metal compound barrier layer on substrates for integrated circuit metallization. Integrated system 175 is configured so as to produce a substantially oxygen-free interface between the barrier layer and the copper layer. A preferred embodiment of integrated system 175 is configured to substantially perform the steps of process flow 20 and variations thereof.

Integrated system 175 comprises a vacuum transfer module 105 connected with a barrier deposition and passivated surface formation module 108A and a loadlock 110. Integrated system 175 also includes a controlled environment transfer module 120 connected with a passivated surface removal module 125, a copper seed deposition module 128, and a copper gapfill module 130. A second loadlock 123 is included in integrated system 100 for joining vacuum transfer module 105 and control environment transfer module 120.

Integrated system 175 is essentially the same as integrated system 100 described for FIG. 3 with the exception that integrated system 175 is configured so that module 108A forms a barrier layer and also forms a passivated surface on the barrier layer. Furthermore, integrated system 175 does not require a separate module for treating the barrier layer for some applications. Integrated system 175 is configured so that the passivated surface is removed in passivated surface removal module 125.

Figure 6:
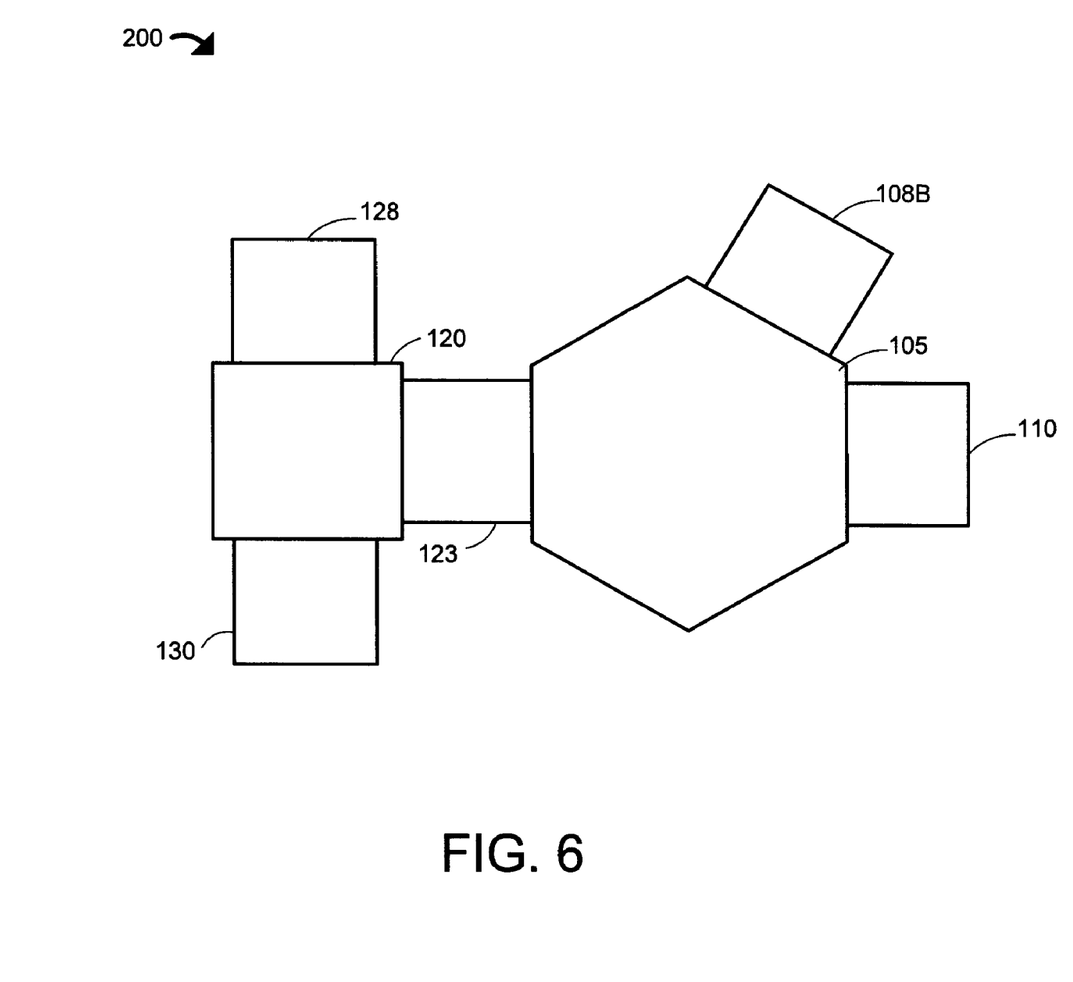
FIG. 6 is a diagram of an embodiment of the present invention.

Reference is now made to FIG. 6 where there is shown a schematic diagram of an exemplary integrated system 200 according to another embodiment of the present invention for depositing a copper layer onto a transition metal barrier layer or transition metal compound barrier layer on substrates for integrated circuit metallization. Integrated system 200 is configured so as to produce a substantially oxygen-free interface between the barrier layer and the copper layer. A preferred embodiment of integrated system 200 is configured to substantially perform the steps of process flow 20 and variations thereof.

Integrated system 200 comprises a vacuum transfer module 105 connected with a barrier deposition and passivated surface formation module 108B and a loadlock 110. Integrated system 200 also includes a controlled environment transfer module 120 connected with a copper seed deposition module 128 and a copper gapfill module 130. A second loadlock 123 is included in integrated system 150 for joining vacuum transfer module 105 and control environment transfer module 120.

Integrated system 200 is essentially the same as integrated system 150 described for FIG. 4 with the exception that integrated system 200 is configured so that module 108B forms a barrier layer and also forms a passivated surface on the barrier layer that is removable in situ during electroless copper deposition. The passivated surface is removed in copper seed deposition module 128 or copper gapfill module 130 as part of or in preparation for copper seed deposition. More specifically, integrated system 200 includes copper seed deposition module 128 configured for passivated surface removal and for copper seed deposition.

Figure 7:
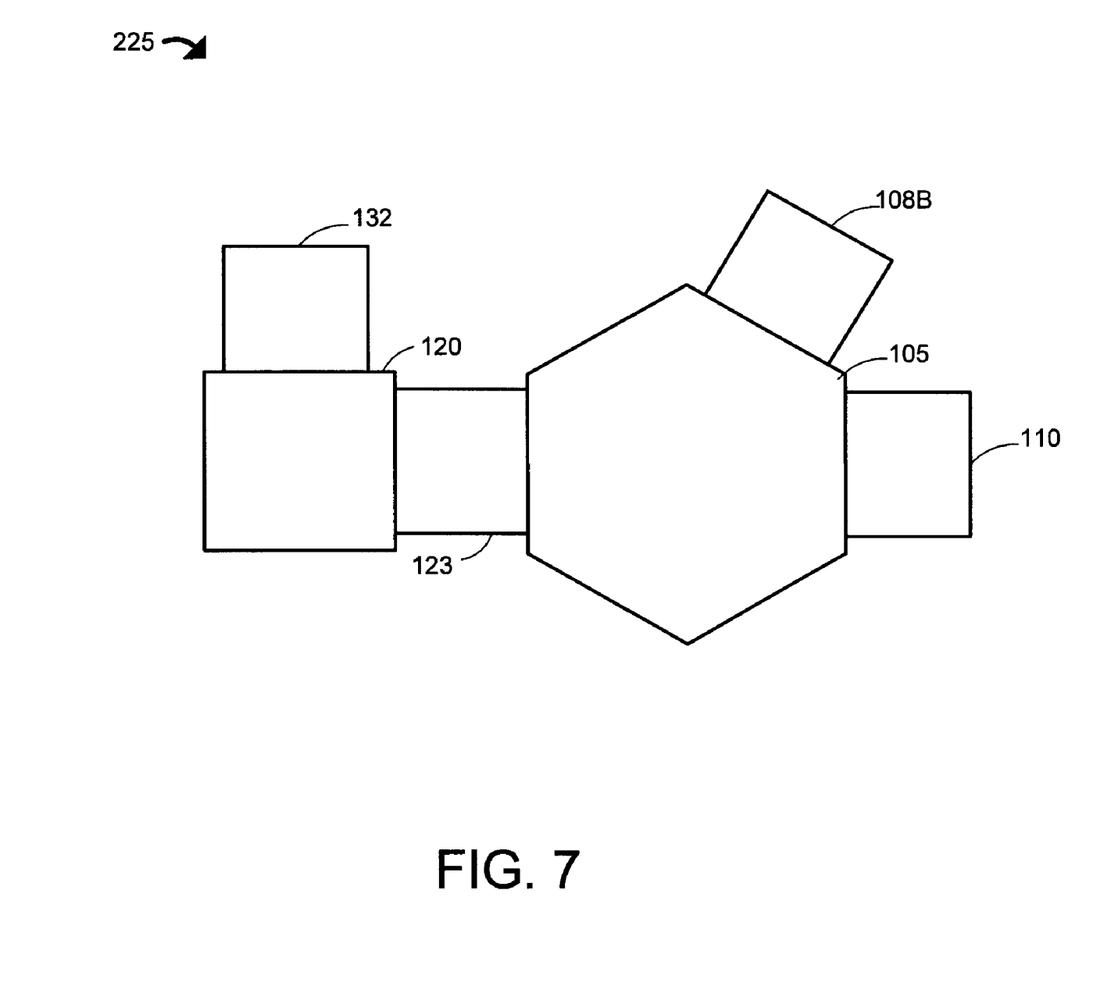
FIG. 7 is a diagram of an embodiment of the present invention.

Reference is now made to FIG. 7 where there is shown a schematic diagram of an exemplary integrated system 225, according to another embodiment of the present invention, for depositing a copper layer onto a transition metal barrier layer or transition metal compound barrier layer on substrates for integrated circuit metallization. Integrated system 225 is configured so as to produce a substantially oxygen-free interface between the barrier layer and the copper layer. A preferred embodiment of integrated system 225 is configured to perform the steps of process flow 20 and variations thereof.

Integrated system 225 comprises a vacuum transfer module 105 connected with a barrier deposition and passivated surface formation module 108B and a loadlock 110. Integrated system 225 also includes a controlled environment transfer module 120 connected with a passivated surface removal and copper gapfill module 132. A second loadlock 123 is included in integrated system 150 for joining vacuum transfer module 105 and controlled environment transfer module 120.

Integrated system 225 is essentially the same as integrated system 200 described for FIG. 6 with the exception that integrated system 225 is configured so that passivated surface removal and copper gapfill module 132 removes the passivated surface and deposits the copper gapfill layer. In one embodiment, module 132 is configured to use an electroless copper deposition process for which the passivated surface formed in module 108B is removed in situ during electroless copper deposition. The passivated surface is removed in module 132 as part of or in preparation for copper seed deposition or copper gapfill.

Another embodiment of the present invention is a system for depositing a copper layer onto a transition metal barrier layer or transition metal compound barrier layer for integrated circuit metallization. The system comprises a barrier deposition and passivated surface formation module configured to form a barrier layer on a substrate and configured to form a passivated surface on the barrier layer. The system further comprises a passivated surface removal and copper deposition module configured to remove the passivated surface from the barrier layer and configured to deposit a copper layer onto the barrier layer. The barrier deposition in passivated surface formation module and the passivated surface removal and copper deposition module are disposed so that substrates processed in the barrier deposition and passivated surface formation module can be processed in the passivated surface removal and copper deposition module after at least one of exposure to an oxygen containing environment, storage for an amount of time, and storage in an oxygen-free environment for an amount of time. The system for this embodiment does not require a transfer module connecting the barrier deposition in passivated surface formation module and the passivated surface removal and copper deposition module.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," "includes," "including," "has," "having," "at least one of," or any other variation thereof, are intended to cover a non-exclusive inclusion. For example, a process, method, article, or apparatus that comprises a list of elements is not necessarily limited only to those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Further, unless expressly stated to the contrary, "at least one of" is to be interpreted to mean "one or more." For example, a process, method, article, or apparatus that comprises one or more of a list of elements and if one or more of the elements comprises a sub-list of sub-elements, then the sub-elements are to be considered in the same manner as the elements. For example, at least one of A and B is satisfied by any one of the following: A is true (or present) and B is false (or not present), A is false (or not present) and B is true (or present), and both A and B are true (or present).

What is claimed is:

1. A method of depositing a gapfill copper layer onto a barrier layer, the method comprising:
 (a) forming the barrier layer on a surface of a substrate;

(b) forming a removable passivated surface accomplished by deposition of at least one of cobalt, rhodium, rhenium, osmium, iridium, and molybdenum on the barrier layer;
(c) removing the removable passivated surface from the barrier layer; and
(d) depositing the gapfill copper layer onto the barrier layer;

wherein forming the removable passivated surface is accomplished by atomic layer deposition.

2. A method of depositing a gapfill copper layer onto a barrier layer, the method comprising:
(a) forming the barrier layer on a surface of a substrate;
(b) forming a removable passivated surface accomplished by deposition of at least one of cobalt, rhodium, rhenium, osmium, iridium, and molybdenum on the barrier layer;
(c) removing the removable passivated surface from the barrier layer; and
(d) depositing the gapfill copper layer onto the barrier layer;

wherein removing the passivated surface is accomplished using a plasma etch process.

3. The method of claim 1, wherein removing the passivated surface is accomplished using a liquid chemical etch process.

4. An integrated system for depositing a copper layer onto a barrier layer, the integrated system comprising:
a barrier deposition module configured to form a barrier layer on a substrate;
a passivated surface formation module configured to form a passivated surface on the barrier layer;
a passivated surface removal module configured to remove the passivated surface from the barrier layer;
a copper gapfill module configured to deposit a gapfill copper layer; and
at least one transfer module configured for vacuum transfer of the substrate or controlled environment transfer of the substrate, the least one transfer module being coupled to the barrier deposition module, the passivated surface formation module, the passivated surface removal module, and the copper gapfill module and configured so that the substrate can be transferred between the modules substantially without exposure to an oxygen containing environment;
wherein the passivated surface formation module is configured to subject the barrier layer to a reactive gas mixture containing at least one of the elements fluorine, bromine, and iodine.

5. An integrated system for depositing a copper layer onto a barrier layer, the integrated system comprising:
a barrier deposition module configured to form a barrier layer on a substrate;
a passivated surface formation module configured to:
subject the barrier layer to a glow discharge containing at least one of the elements fluorine, bromine, and iodine; or
deposit at least one of cobalt, rhodium, rhenium, osmium, iridium, ruthenium, and molybdenum;
a passivated surface removal module configured to remove the passivated surface from the barrier layer;
a copper gapfill module configured to deposit a gapfill copper layer; and
at least one transfer module configured for vacuum transfer of the substrate or controlled environment transfer of the substrate, the least one transfer module being coupled to the barrier deposition module, the passivated surface formation module, the passivated surface removal module, and the copper gapfill module and configured so that the substrate can be transferred between the modules substantially without exposure to an oxygen containing environment.

6. The system of claim 5, wherein the passivated surface removal module comprises a plasma etch module or a liquid chemical etch module.

7. The system of claim 5, wherein the copper gapfill module comprises at least one of:
an electroless deposition module and
an electrochemical plating module.

8. An integrated system for depositing a gapfill copper layer onto a barrier layer, the integrated system comprising:
a barrier deposition module configured to form a barrier layer on a substrate;
a passivated surface formation module configured to form a passivated surface on the barrier layer;
a passivated surface removal and copper deposition module configured to remove the passivated surface from the barrier layer and to deposit the copper layer onto the barrier layer; and
at least one transfer module configured for vacuum transfer of the substrate or controlled environment transfer of the substrate, the least one transfer module being coupled to the barrier deposition module, the passivated surface formation module, and the passivated surface removal and copper deposition module so that the substrate can be transferred between the modules substantially without exposure to an oxygen-containing environment;
wherein the passivated surface formation module is configured to subject the barrier layer to a reactive gas mixture containing at least one of the elements fluorine, bromine, and iodine.

9. An integrated system for depositing a gapfill copper layer onto a barrier layer, the integrated system comprising:
a barrier deposition module configured to form a barrier layer on a substrate;
a passivated surface formation module configured to form a passivated surface on the barrier layer;
a passivated surface removal and copper deposition module configured to remove the passivated surface from the barrier layer and to deposit the copper layer onto the barrier layer; and
at least one transfer module configured for vacuum transfer of the substrate or controlled environment transfer of the substrate, the least one transfer module being coupled to the barrier deposition module, the passivated surface formation module, and the passivated surface removal and copper deposition module so that the substrate can be transferred between the modules substantially without exposure to an oxygen-containing environment;
wherein the passivated surface formation module comprises an atomic layer deposition module, a silicon deposition module, or a silicidation module.

10. An integrated system for depositing a copper layer onto a barrier layer, the integrated system comprising:
a barrier deposition and passivated surface formation module configured to form a barrier layer on a substrate and configured to form a passivated surface on the barrier layer;
a passivated surface removal and copper deposition module configured to remove the passivated surface from the barrier layer and to deposit a copper layer onto the barrier layer; and
at least one of
a vacuum transfer module and
a controlled environment transfer module coupled to the barrier deposition and passivated surface formation module and the passivated surface removal and copper deposition module and configured so that the substrate can be transferred between the modules substantially without exposure to an oxide-forming environment;

wherein the passivated surface is removable in an electroless copper deposition process and the passivated surface removal and copper deposition module is configured to deposit copper by electroless copper deposition or electroless copper deposition and electrochemical copper plating; the barrier deposition and passivated surface formation module is configured to deposit tantalum nitride by atomic layer deposition and to form a passivated surface on the tantalum nitride, the passivated surface is autocatalytic for electroless copper deposition; and the passivated surface removal and copper deposition module is configured to deposit copper by electroless copper deposition or electroless copper deposition and electrochemical copper plating.

11. The system of claim 5, wherein the barrier deposition module is configured to deposit tantalum or tantalum nitride.

12. The system of claim 5, wherein the passivated surface formation module is alternatively configured to subject the barrier layer to a reactive gas mixture containing at least one of the elements fluorine, bromine, and iodine.

* * * * *